US012613319B2

(12) United States Patent
Wang

(10) Patent No.: US 12,613,319 B2
(45) Date of Patent: Apr. 28, 2026

(54) OPTICAL SENSOR AND PHOTODIODE

(71) Applicant: PixArt Imaging Inc., Hsin-Chu City (TW)

(72) Inventor: Yu-Wei Wang, Hsin-Chu City (TW)

(73) Assignee: PixArt Imaging Inc., Hsin-Chu City (TW)

(*) Notice: Subject to any disclaimer, the term of this patent is extended or adjusted under 35 U.S.C. 154(b) by 1024 days.

(21) Appl. No.: 17/740,371

(22) Filed: May 10, 2022

(65) Prior Publication Data

US 2023/0366991 A1 Nov. 16, 2023

(51) Int. Cl.
*G01S 7/4863* (2020.01)
*G01S 17/10* (2020.01)
*H10F 30/225* (2025.01)
*H10F 39/18* (2025.01)

(52) U.S. Cl.
CPC ............ *G01S 7/4863* (2013.01); *G01S 17/10* (2013.01); *H10F 30/225* (2025.01); *H10F 39/18* (2025.01)

(58) Field of Classification Search
CPC ...... G01S 7/4863; G01S 17/10; H10F 30/225; H10F 39/18
See application file for complete search history.

(56) References Cited

U.S. PATENT DOCUMENTS

2018/0019268 A1* 1/2018 Zhang .................. H10F 39/199

FOREIGN PATENT DOCUMENTS

CN 114284376 A * 4/2022

* cited by examiner

*Primary Examiner* — Jay C Kim
*Assistant Examiner* — Woo K Lee
(74) *Attorney, Agent, or Firm* — Winston Hsu

(57) ABSTRACT

A photodiode, comprising: a first photodiode, comprising a p type substrate and a signal output region; a positive electric field providing structure, provided in the P type substrate, configured to receive a positive voltage to provide a positive electric field according to the positive voltage to attract electrons in the P type substrate; wherein an avalanche region is formed when the positive voltage is larger than a threshold voltage, thereby a current path is formed between the signal output region and the positive electric field providing structure. The present invention also discloses an optical sensor comprising pixels with different light sensitivities.

2 Claims, 6 Drawing Sheets

OPTICAL SENSOR AND PHOTODIODE

BACKGROUND OF THE INVENTION

1. Field of the Invention

The present invention relates to an optical sensor and a photodiode, and particularly relates to an optical sensor which has pixels with different light sensitivities, and relates to a photodiode which can improve photon detection efficiencies.

2. Description of the Prior Art

In recent years, an optical distance measuring device becomes more and more popular. Such optical distance measuring device has an image sensor for capturing images which are used for distance computation. However, the pixels in the conventional image sensor have the same light sensitivities. Thus, the overexposure issue may happen thus causes non accurate distance computation. For example, if the optical distance measuring device is too close to an object, the image sensor may receive strong reflected light from the object, thus the overexposure issue occurs.

Also, the conventional photodiode may have a low photon detection efficiency since it is hard to attract the electrons in the deep p type substrate. Alternatively, the p type substrate needs to be coupled to a negative voltage level. However, the p type substrates of some other circuits could not be coupled to the negative voltage level. Therefore, such structure may cause the difficulty for designing an IC (Integrated Circuit) comprising a photodiode.

SUMMARY OF THE INVENTION

Therefore, one objective of the present invention is to provide an optical sensor having pixels with different light sensitivities.

Another objective of the present invention is to provide a photodiode which has better photon detection efficiencies without coupling the P substrate to a negative voltage level.

One embodiment of the present invention discloses an optical sensor, comprising: at least one first pixel, comprising a first photodiode with a first light sensitivity; and at least one second pixel, comprising a second photodiode with a second light sensitivity; wherein the first light sensitivity is higher than the second light sensitivity.

Another embodiment of the present invention discloses a photodiode, comprising: a p type substrate; a first P doped region, provided in the p type substrate, served as a signal output region for outputting a light sensing signal; a first N doped region, provided in the p type substrate, for receiving a positive voltage; a second P doped region, provided in the P type substrate, below the first P doped region and the first N doped region; wherein an avalanche region is formed between the second P doped region and the first N doped region when the positive voltage is larger than a threshold voltage.

Still another embodiment of the present invention discloses a photodiode, comprising: a first photodiode, comprising a p type substrate and a signal output region; a positive electric field providing structure, provided in the P type substrate, configured to receive a positive voltage to provide a positive electric field according to the positive voltage to attract electrons in the P type substrate; wherein an avalanche region is formed when the positive voltage is larger than a threshold voltage, thereby a current path is formed between the signal output region and the positive electric field providing structure.

In view of above-mentioned embodiments, the optical sensor can selectively select proper pixels for sensing optical data or make sure at least portion of the pixels operate normally even the object is close, since the optical sensor comprises high sensitivity pixels and low sensitivity pixels. Also, the photo diode provided by the present invention can have better photon detection efficiencies without coupling the P substrate to a negative voltage level.

These and other objectives of the present invention will no doubt become obvious to those of ordinary skill in the art after reading the following detailed description of the preferred embodiment that is illustrated in the various figures and drawings.

DETAILED DESCRIPTION

The term "first", "second", "third" in following descriptions are only for the purpose of distinguishing different one elements, and do not mean the sequence of the elements. For example, a first device and a second device only mean these devices can have the same structure but are different devices.

Figure 1:
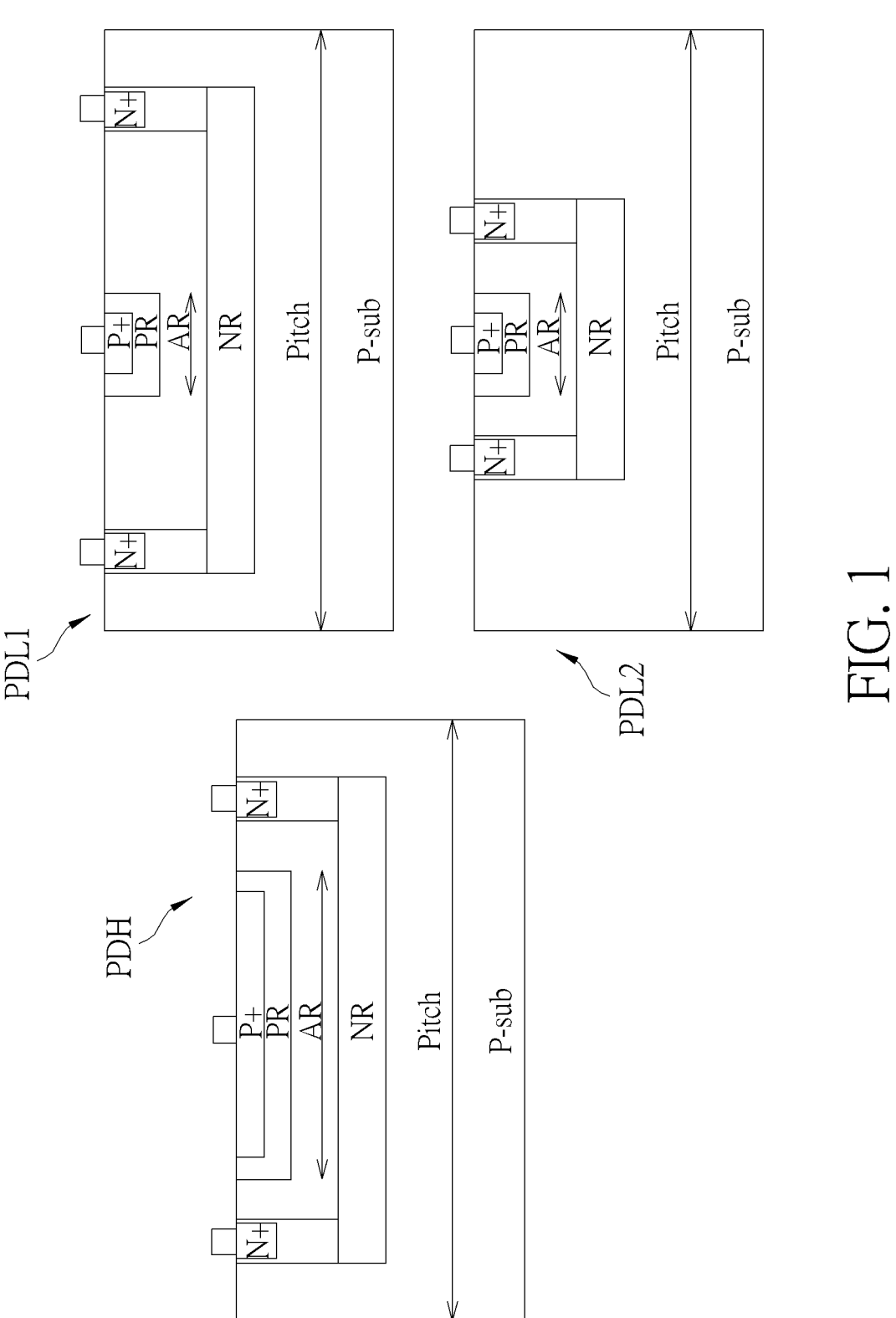
FIG. 1 is a cross section view illustrating a photodiode according to one embodiment of the present invention.

FIG. 1 is a cross section view illustrating a photodiode according to one embodiment of the present invention. In FIG. 1, the symbol PDH means a photodiode with a high light sensitivity (herein after, high sensitivity photodiode), and the symbols PDL1, PDL2 mean photodiodes with a low light sensitivity (herein after, low sensitivity photodiode). The light sensitivity means the number electrons which the photodiode generates while receiving light with the same intensity. Therefore, while receiving light with the same intensity, a high sensitivity photodiode generates more electrons (i.e., a larger current) than a low sensitivity photodiode.

In the embodiment of FIG. 1, a length of an active region AR of the high sensitivity photodiode PDH is larger than a length of an active region AR of the low sensitivity photodiodes PDL1, PDL2. As known by persons skilled in the art, the active region AR means a region which forms a PN or NP junction that can convert photons into current. Therefore, the length of an active region AR means a length along the N region and the P region PR. In one embodiment, the active region AR means an over lapped region of projections of the P doped region and the N doped region.

Also, in the embodiment of FIG. 1, a pitch of the high sensitivity photodiode PDH and pitches of the low sensitivity photodiodes PDL1, PDL2 are identical. However, a pitch of the high sensitivity photodiode PDH and pitches of the low sensitivity photodiodes PDL1, PDL2 can be different. Therefore, the pitches of the high sensitivity photodiode PDH and pitches of the low sensitivity photodiodes PDL1, PDL can be set corresponding to different requirements.

In the embodiment of FIG. 1, each of the high sensitivity photodiode PDH and the low sensitivity photodiodes PDL1, PDL has a P type substrate P-sub, a P doped region P+, a P doped region PR, and N doped regions N+. The doping concentration of the P doped region P+ is higher than the doping concentration of the P doped region PR. Also, the doping concentrations of the N doped regions N+ are higher than the doping concentration of the N doped region NR. Also, the active region AR is between the P doped region PR and the N doped region NR. Please note, the concept disclosed in FIG. 1 is not limited to be applied to a photodiode having the structure illustrated in FIG. 1. The concept of "setting light sensitivities via the lengths of the active regions" can be applied to a photodiode with any other structure.

Besides the active regions, the light sensitivities can also be adjusted via other factors. In one embodiment, the high sensitivity photodiode has a voltage receiving region for receiving a first operating voltage and the low sensitivity photodiode has a voltage receiving region for receiving a second operating voltage. An absolute value of the first operating voltage is higher than the second operating voltage. In one example, either the high sensitivity photodiode or the low sensitivity photodiode has the structure of the high sensitivity photodiode PDH in FIG. 1. In such example, the N doped regions N+ of the high sensitivity photodiode receive a first positive voltage and the N doped regions N+ of low high sensitivity photodiode receive a second positive voltage lower than the first positive voltage.

Figure 2:
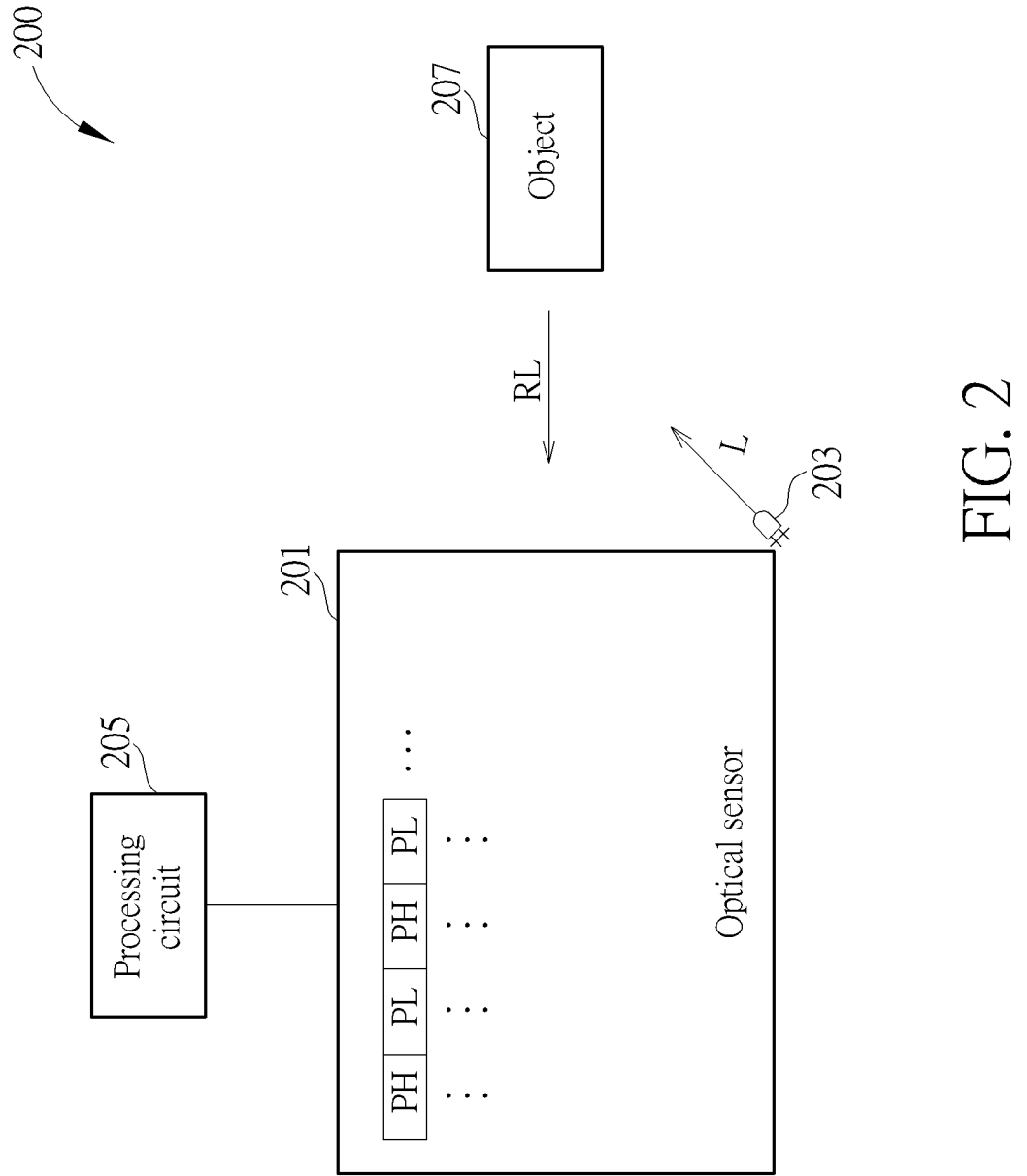
FIG. 2 is a block diagram illustrating an optical distance measuring device applying the photodiodes illustrated in FIG. 1, according to one embodiment of the present invention.

In one embodiment, the above-mentioned high sensitivity photodiode and low sensitivity photodiode are applied to an optical sensor. The optical sensor can be an image sensor for sensing images, but it can be a sensor sensing other kinds of optical data. As illustrated in FIG. 2, the optical sensor 201 comprises high sensitivity pixels PH and low sensitivity pixels PL. The high sensitivity pixel PH has the above-mentioned high sensitivity photodiode and the low sensitivity pixel PL has the above-mentioned low sensitivity photodiode. It will be appreciated that the arrangement of the high sensitivity pixels PH and low sensitivity pixels PL is not limited to the arrangement illustrated in FIG. 2.

In the embodiment of FIG. 2, the optical sensor 201 is applied to a distance measuring device 200, which further comprises a light source 203 and a processing circuit 205. The light source 203 generates light L and the optical sensor 201 senses optical generated based on reflected light RL of the light L. In such case, the high sensitivity pixels PH are configured to generate first optical data according to signals generated by the high sensitivity photodiodes therein. Also, the low sensitivity pixels PL are configured to generate second optical data according to signals generated by the low sensitivity photodiode therein. The first optical data is used for computing a distance between an object 507, when the distance is in a first distance range. Additionally, the second optical data is used for computing the distance but the first optical data is not used for computing the distance, when the distance is in a second distance range, wherein first distance range is larger than the second distance range.

Briefly, when the distance measuring device 200 is far from the object, the processing circuit 205 computes the distance according to the first optical data. In such case, the second optical data can also be applied to compute the distance, or not applied to compute the distance. Further, when the distance measuring device 200 is close to the object, the processing circuit 205 computes the distance according to the second optical data but not according to the first optical data. Many methods can be applied to perform such step. For example, the addresses or the locations of the high sensitivity pixels PH and the low sensitivity pixels PL can be prerecorded, thus the processing circuit 205 can know where the optical data is from.

In one embodiment, when the distance measuring device 200 is close to the object, the first optical data may be over exposed since it is generated by the high sensitivity pixels PH, thus if the distance measuring device 200 ignores the over exposed optical data, the processing circuit 205 may only uses the second optical data to compute the distance.

Please note, the above-mentioned optical sensor 201 is not limited to be applied to a distance measuring device. Therefore, the optical sensor provided by the present invention can be summarized as: an optical sensor, comprising: at least one first pixel, comprising a first photodiode (e.g., high sensitivity photodiode PDH) with a first light sensitivity; and at least one second pixel, comprising a second photodiode with a second light sensitivity (e.g., low sensitivity photodiode PDL); wherein the first light sensitivity is higher than the second light sensitivity.

Figure 3:
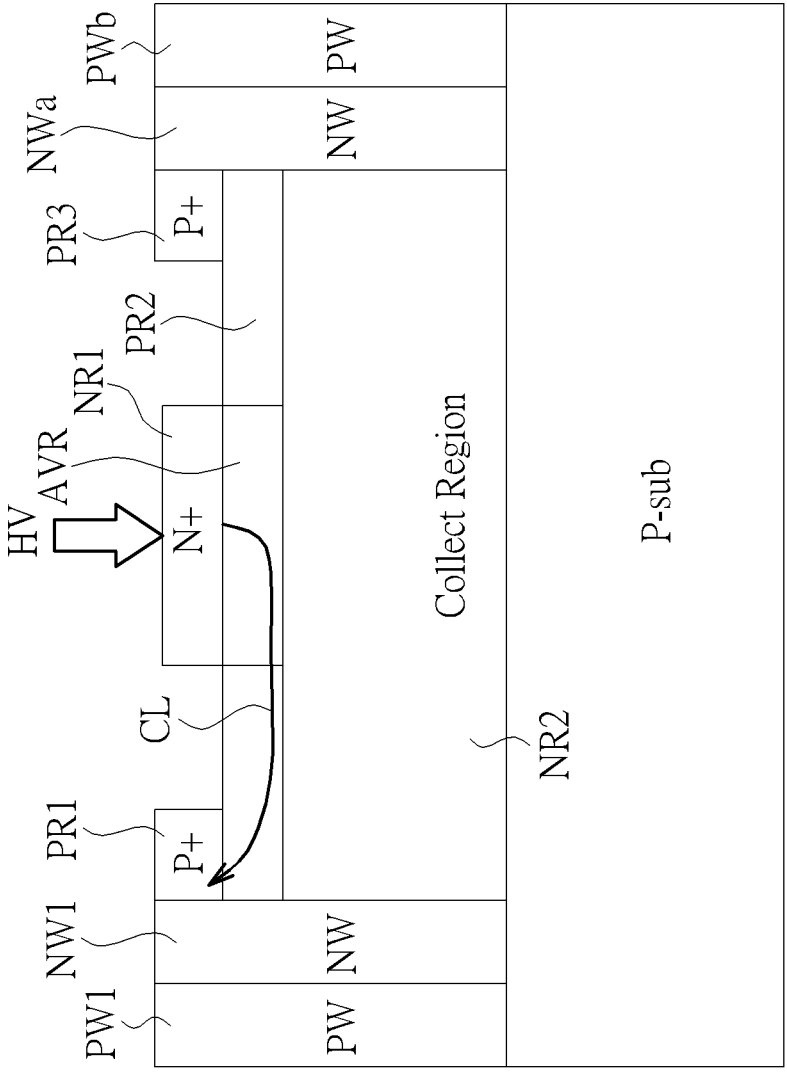
FIG. 3, FIG. 4, and FIG. 5 are cross section views illustrating photodiodes according to different embodiments of the present invention.
Figure 4:
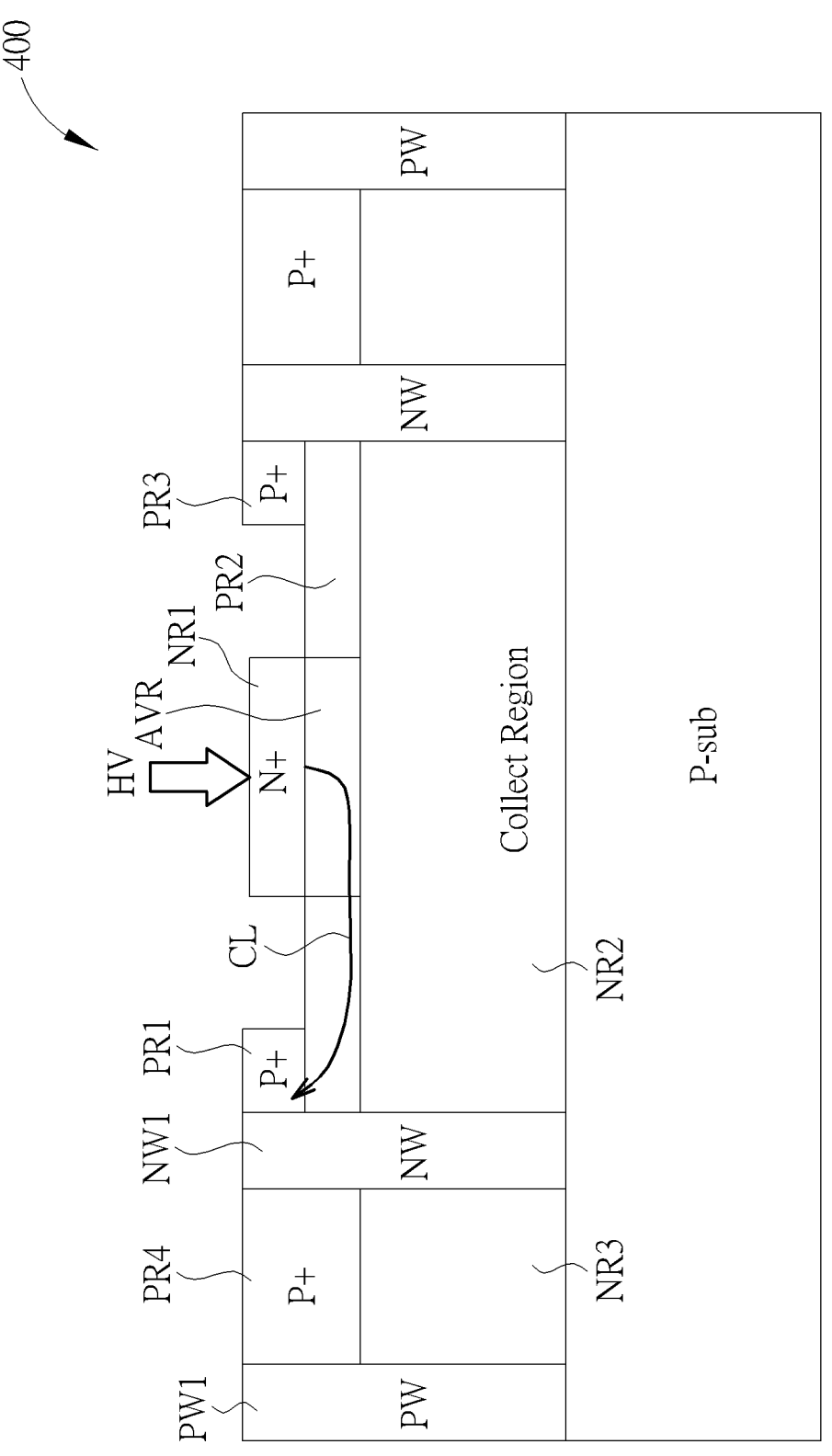
Figure 5:
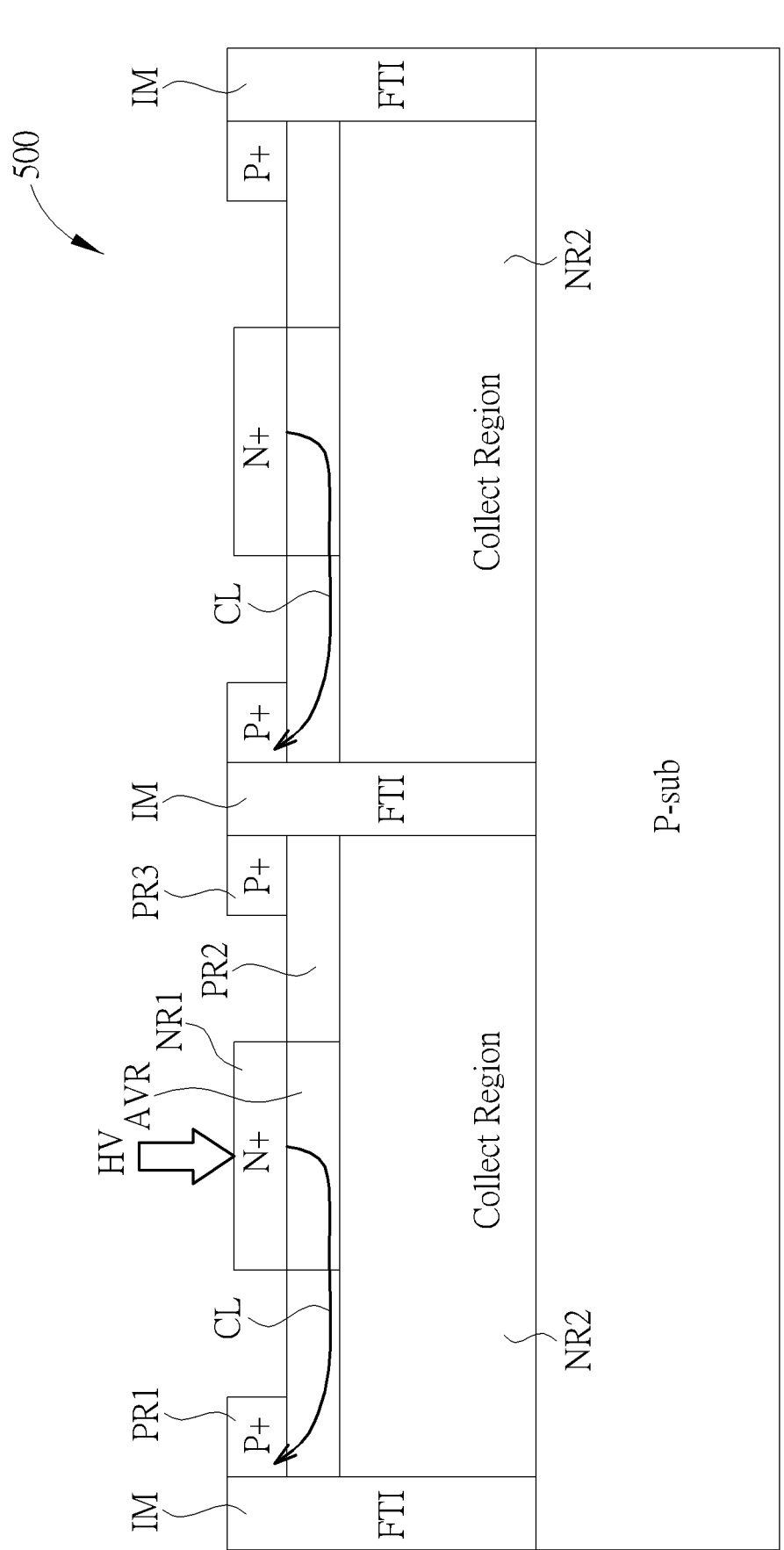

Besides the above-mentioned optical sensor comprising high sensitivity pixels and low sensitivity pixels, the present invention also discloses photodiodes which can improve photon detection efficiencies. FIG. 3, FIG. 4, and FIG. 5 are cross section views illustrating photodiodes according to different embodiments of the present invention. Such photodiodes can also be used as the high sensitivity photodiodes illustrated in above-mentioned embodiments.

As illustrated in FIG. 3, the photodiode 300 comprises: a p type substrate P-sub, a first N doped region NR1, a second N doped region NR2, a first P doped region PR1, a second P doped region PR2, a third P doped region PR3, a first N well NW1, and a first P well PW1. The doping concentration of the first P doped region PR1 is larger than the doping concentration of the second P doped region PR2. Also, the doping concentration of the first N doped region NR1 is larger than the doping concentration of the second N doped region NR2. Please note, the photodiode 300 in FIG. 3 has a symmetrical structure, thus it also has an N well NWa corresponding to the first N well NW1 and a P well PWb corresponding to the first P well PW1, at the right side thereof. In one embodiments, the first P well PW1 and the P well PWb are for isolating different photodiodes. The embodiments illustrated below also follow the same rule.

The first P doped region PR1 is provided in the p type substrate P_sub, and is served as a signal output region for outputting a light sensing signal. Specifically, the first P doped region PR1 outputs a light sensing current CL corresponding to the light received by the photodiode 300. The first N doped region NR1 is provided in the p type substrate P_sub, for receiving a positive voltage HV. The second P doped region PR2 provided in the P type substrate P-sub, is below the first P doped region PR1 and the first N doped region NR1. An avalanche region AVR is formed between the second P doped region PR2 and the first N doped region PR1 when the positive voltage HV is larger than a threshold voltage. In other words, the avalanche region AVR is formed between the second P doped region PR2 and the first N doped region NR1 when the positive voltage HV is larger than a threshold voltage. In one embodiment, the first P doped region PR1, the second P doped region PR2 and the third P doped region PR3 form a single P doped region when the avalanche region AVR is not formed. For example, if the first N doped region NR1 does not receive the positive voltage HV or the positive voltage HV is too low, the avalanche region AVR is not formed. In such case, the first P doped region PR1, the second P doped region PR2 and the third P doped region PR3 form a single P doped region.

The second N doped region NR2 is below the first P doped region PR2. Also, the first N well NW1 is provided in the P type substrate P-sub and next to the first P doped region PR1 and the second N doped region NR2. Additionally, the first P well PW1 is provided in the P type substrate P-sub and next to the first N well NW1. The second N doped region NR2 can be regarded as a collect region for help collecting the electrons in the P substrate P-sub there below.

Via the first N doped region NR1 and the second N doped region NR2 illustrated in FIG. 1, a positive electric field can be provided according to the positive voltage HV to attract electrons either in a shallow portion or in a deep portion of the P type substrate, and the P substrate P-sub can be coupled to a ground rather than a negative voltage level. By this way, the light sensing current CL can be formed in the avalanche region AVR and outputted by the first P doped region PR1. Therefore, the photon sensing efficiency can be raised and the issues of conventional photodiodes can be improved.

The photodiode provided by the present invention is not limited to have a structure illustrated in FIG. 3. For example, in one embodiment, the photodiode does not comprise the second doped region NR2. Also, as illustrated in FIG. 4, besides the p type substrate P-sub, the first N doped region NR1, the second N doped region NR2, the first P doped region PR1, the second P doped region PR2, the third P doped region PR3, the first N well NW1, and the first P well PW1 illustrated in FIG. 3, the photodiode 400 further comprises a fourth P doped region PR4 and a third N doped region NR3. The fourth P doped region NR4 is provided in the P type substrate P-sub and next to the first N well NW1. The third N doped region NR3 is provided in the P type substrate P-sub, next to the first N well NW1 and below the fourth P doped region PR4. The fourth doped region PR4 can be used for protecting the photodiode. The third N doped region NR3 is also served as a collect region for help collecting the electrons in the P substrate P-sub there below. Via the third N doped region NR3, an area that the collect region can cover is increased thus more electrons in the P substrate P-sub can be attracted.

The photodiode 400 in FIG. 4 can further comprise a first P well PW1 provided in the P type substrate P-sub and next to the fourth P doped region PR4 and the third N doped region NR3. The first P well PW1 can be used for isolating different photodiodes.

In the embodiment of FIG. 4, the fourth P doped region PR4, the third N doped region NR3 and the P substrate P-sub can be regarded as a photodiode. Therefore, the photodiode 400 in FIG. 4 can be regarded as: a photodiode, comprising: a first photodiode, comprising a p type substrate (e.g., the P substrate P-sub) and a signal output region (e.g., the first P doped region PR1); a positive electric field providing structure, provided in the P type substrate, configured to receive a positive voltage (e.g., the first doped region NR1 receiving the positive voltage HV) to provide a positive electric field according to the positive voltage to attract electrons in the P type substrate. An avalanche region is formed when the positive voltage is larger than a threshold voltage, thereby a current path is formed between the signal output region and the positive electric field providing structure. In one embodiment, besides the first doped region NR1, the positive electric field providing structure further comprises the second doped region NR2.

FIG. 5 is a schematic diagram illustrating a photodiode according to another embodiment of the present invention.

As illustrated in FIG. 5, besides the p type substrate P-sub, the first N doped region NR1, the second N doped region NR2, the first P doped region PR1, the second P doped region PR2, and the third P doped region PR3 illustrated in FIG. 3, the photodiode 500 further comprises isolation structure IM provided next to the first P doped region PR1 the second P doped region PR2, and the second N doped region NR2. The isolation structure IM can be used for isolating different photodiodes, which can implemented be various structures. In one embodiment, the isolation structure IM is a FTI (full trench isolation structure).

Figure 6:
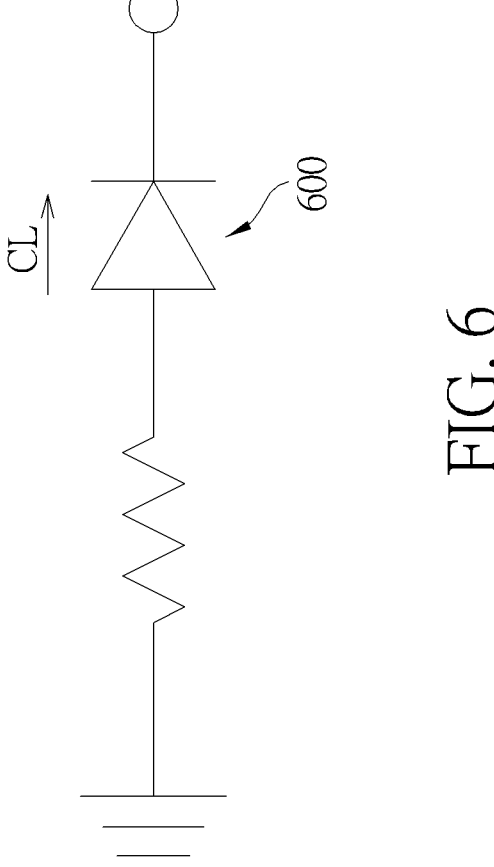
FIG. 6 is a circuit diagram illustrating the photodiode provided by the present invention is coupled to a resistor.

In one embodiment, the third P doped region PR3 and the first P doped region PR1 in above-mentioned embodiments are coupled to a resistor. FIG. 6 is a circuit diagram illustrating the photodiode provided by the present invention is coupled to a resistor. FIG. 6 is a circuit diagram illustrating the photodiode 600 provided by the present invention is coupled to a resistor 601. The resistor 601 works as a quenching resistor, which divides the bias on the photodiode 600 and the avalanche region is quenched as the voltage drop on the photodiode 600 is reduced.

In view of above-mentioned embodiments, the optical sensor can selectively select proper pixels for sensing optical data or make sure at least portion of the pixels operate normally even the object is close, since the optical sensor comprises high sensitivity pixels and low sensitivity pixels. Also, the photodiode provided by the present invention can have better photon detection efficiencies without coupling the P substrate to a negative voltage level.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photodiode, comprising:
    a p type substrate;
    a first P doped region, provided in the p type substrate, served as a signal output region for outputting a light sensing signal;
    a first N doped region, provided in the p type substrate, for receiving a positive voltage;
    a second P doped region, provided in the P type substrate, below the first P doped region and the first N doped region;
    wherein an avalanche region is formed between the second P doped region and the first N doped region when the positive voltage is larger than a threshold voltage;
    wherein the photodiode further comprising:
    a second N doped region below the second P doped region, wherein the second N doped region is used for collecting electrons;
    a first N well provided in the P type substrate and next to the first P doped region and the second N doped region; and
    a first P well provided in the P type substrate and next to the first N well.

2. The photodiode of claim 1, further comprising a third P doped region above the second P doped region, wherein the first P doped region and the third P doped region are coupled to a resistor.

\* \* \* \* \*